United States Patent
Styduhar

(10) Patent No.: US 6,894,577 B2
(45) Date of Patent: May 17, 2005

(54) APPARATUS FOR PROVIDING POWER CONTROL TO A REAL-TIME CLOCK OSCILLATOR

(75) Inventor: Mark S. Styduhar, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 10/249,737

(22) Filed: May 5, 2003

(65) Prior Publication Data

US 2004/0222864 A1 Nov. 11, 2004

(51) Int. Cl.$^7$ ................................................ H03B 5/32
(52) U.S. Cl. ............................... 331/183; 331/116 FE; 331/158
(58) Field of Search ......................... 331/183, 116 FE, 331/158, 182, 160, 116 R; 713/600

(56) References Cited

U.S. PATENT DOCUMENTS

| | | | |
|---|---|---|---|
| 4,355,361 A | 10/1982 | Riggs et al. ................. 713/600 |
| 4,896,122 A * | 1/1990 | Tahernia et al. ............. 331/158 |
| 5,216,357 A | 6/1993 | Coppola et al. ............. 324/142 |
| 5,493,203 A | 2/1996 | Dalton ........................ 323/282 |
| 6,009,319 A | 12/1999 | Khullar et al. .............. 340/7.38 |
| 6,016,045 A | 1/2000 | Thomas et al. ............. 320/107 |
| 6,023,690 A | 2/2000 | Chrosny et al. ............ 705/405 |
| 6,172,575 B1 * | 1/2001 | Shinmori .............. 331/116 FE |
| 6,329,884 B1 * | 12/2001 | Tsukagoshi et al. ... 331/116 FE |

* cited by examiner

*Primary Examiner*—Robert Pascal
*Assistant Examiner*—Joseph Chang
(74) *Attorney, Agent, or Firm*—Richard A. Henkler; Dillon & Yudell LLP

(57) ABSTRACT

An apparatus for providing power control to a real-time clock oscillator is disclosed. The apparatus includes a clock oscillator, a set of current limiting resistors and a set of latches. The current limiting resistors are coupled between a power supply and the clock oscillator. Coupled to the clock oscillator and the current limiting resistors, the latches control the current limiting resistors to limit the amount of current flowing from the power supply to the clock oscillator such that the power consumption by the clock oscillator is minimized.

14 Claims, 5 Drawing Sheets

APPARATUS FOR PROVIDING POWER CONTROL TO A REAL-TIME CLOCK OSCILLATOR

BACKGROUND OF INVENTION

1. Technical Field

The present invention relates to integrated circuit devices in general, and, in particular, to integrated circuit devices having a real-time clock oscillator. Still more particularly, the present invention relates to an apparatus for controlling power to a real-time clock oscillator within an integrated circuit device.

2. Description of the Related Art

A real-time clock oscillator within an integrated circuit device typically receive its power from a battery external to the integrated circuit device. Since the battery has a limited lifetime, it is crucial for the real-time clock oscillator to draw a minimal amount of current in order to preserve the life of the battery.

Referring now to the drawings and in particular to FIG. 1, there is depicted a circuit diagram of a real-time clock oscillator, according to the prior art. As shown, a real-time clock oscillator 10 includes an inverting amplifier 11, a feedback resistor 12, a drive resistor 13, a crystal 14 and capacitors 15–16. Inverting amplifier 11, feedback resistor 12, and drive resistor 13 are usually incorporated within an integrated circuit device (i.e., on-chip). On the other hand, crystal 14 and capacitors 15–16 are usually discrete devices external to the integrated circuit device (i.e., off-chip) and are mounted on a printed circuit board. The majority of the power consumed by oscillator circuit 10 is through inverting amplifier 11.

With reference now to FIG. 2, there is depicted a circuit diagram of inverting amplifier 11 according to the prior art. As shown, inverting amplifier 11 includes a p-channel transistor 21 and an n-channel transistor 22. Although transistors 21 and 22 are connected in an inverter configuration, transistors 21 and 22 operate largely in the saturation region throughout each oscillator cycle. Hence, the majority of the power dissipation of inverting amplifier 11 is attributed to shoot-through current from a power supply $V_{DD}$ passing through inverting amplifier 11 to ground.

The present disclosure provides a solution to minimize the DC current so that the power loss through an inverting amplifier within a real-time clock oscillator, such as inverting amplifier 11, can be minimized. As a result, the power consumption of the real-time clock oscillator can also be minimized.

SUMMARY OF INVENTION

In accordance with a preferred embodiment of the present invention, an apparatus for controlling power to a real-time clock oscillator includes a clock oscillator, a set of current limiting resistors, two comparators, a set of latches with a state machine logic circuit, a clock gating control logic circuit, and a decoding logic circuit. The current limiting resistors are coupled between a power supply and the clock oscillator. Coupled to the clock oscillator and the current limiting resistors, the latches control the current limiting resistors to limit the amount of current flowing from the power supply to the clock oscillator such that the power consumption by the clock oscillator is minimized. The clock gating control logic circuit control the propagation of clock signals throughout the latches. The decoding logic circuit detects a low battery voltage condition of the real-time clock oscillator.

All objects, features, and advantages of the present invention will become apparent in the following detailed written description.

BRIEF DESCRIPTION OF DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

Figure 1:
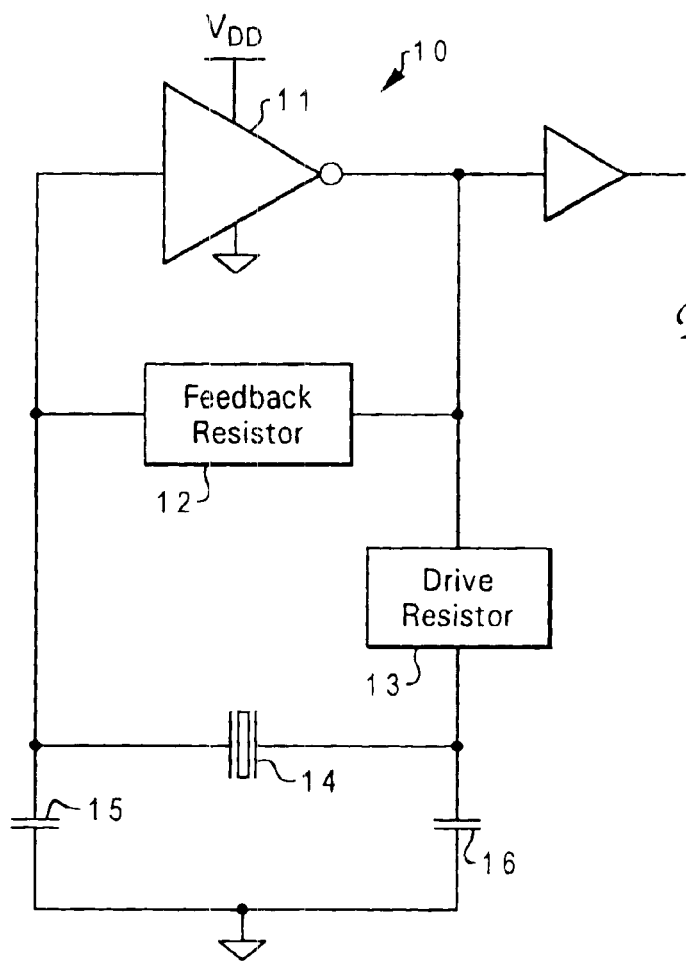
FIG. 1 is a circuit diagram of a real-time clock oscillator, according to the prior art.
Figure 2:
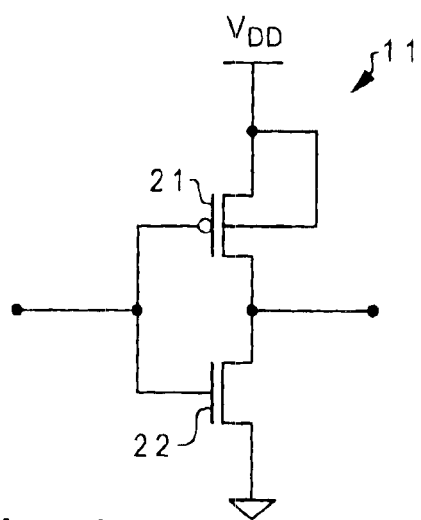
FIG. 2 is a circuit diagram of an inverting amplifier within the real-time clock oscillator from FIG. 1, according to the prior art.
Figure 3A:
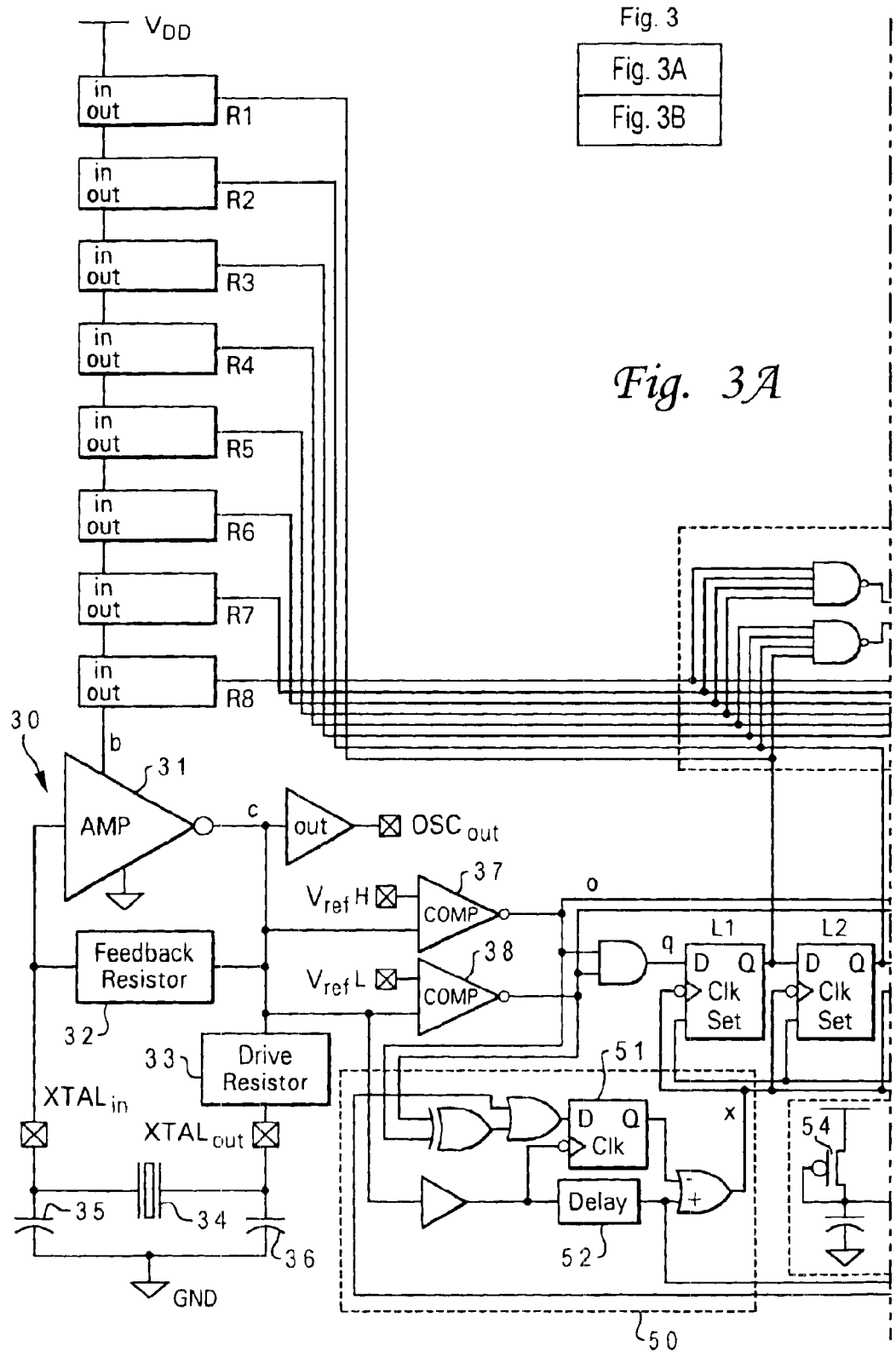
FIG. 3 is a circuit diagram of a real-time clock oscillator, in accordance with a preferred embodiment of the present invention.
Figure 3B:
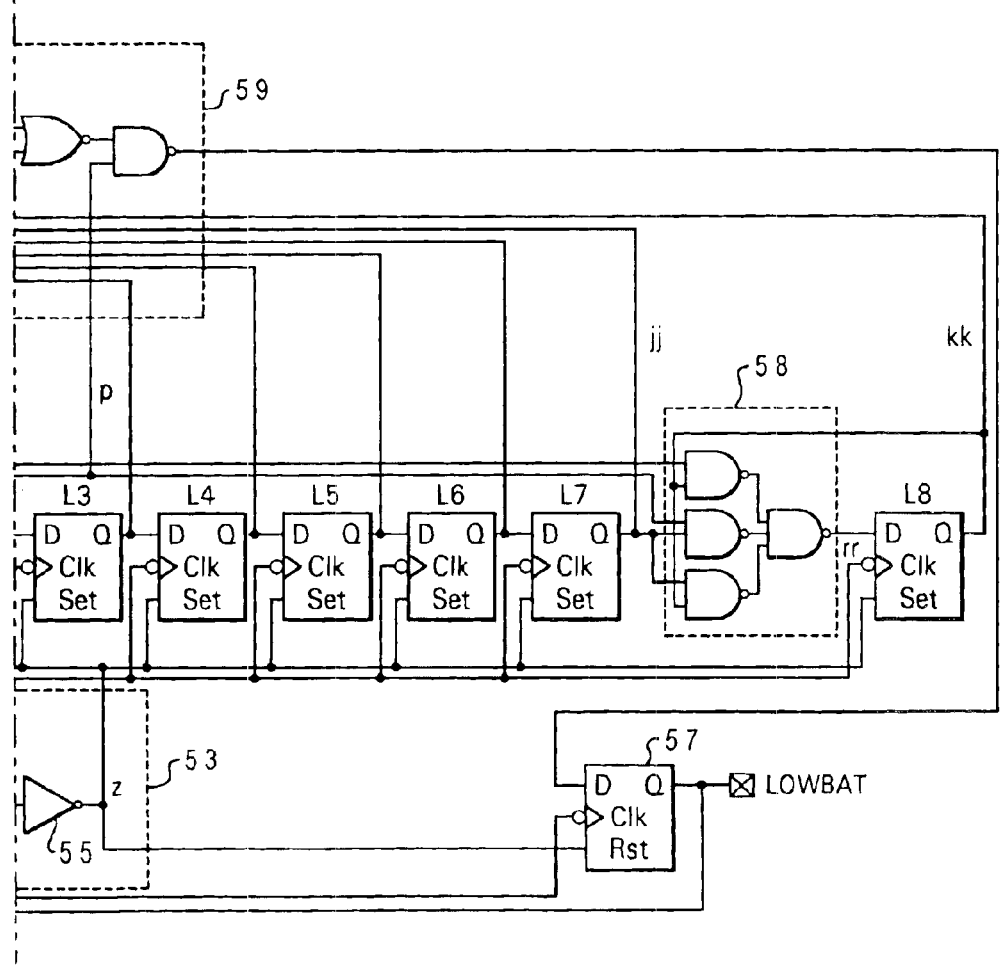

Referring now to FIG. 3, there is depicted a circuit diagram of a real-time clock oscillator having a power control mechanism, in accordance with a preferred embodiment of the present invention. As shown, a clock oscillator 30 is coupled to a set of current limiting resistors R1–R8, a set of latches L1–L8 with a state machine logic circuit 58, two comparators 37–38, a clock gating control logic circuit 50, and a decoding logic circuit 59. Clock oscillator 30 includes an inverting amplifier 31, a feedback resistor 32, a drive resistor 33, a crystal 34 and capacitors 35–36. $V_{DD}$ and GND are power supply rails for clock oscillator 30. For the purpose of the present description, $V_{DD}$ is assumed to be 1.8 V nominal with GND at 0 V Current limiting resistors R1–R8 are connected in series between VDD and a power supply input (i.e., node b) of inverting amplifier 31. The resistance of each of current limiting resistors R1–R8 can be toggled between high and low via a resistance control input. Incidentally, the more current limiting resistors R1–R8 being set at a high resistance state, the less current can flow from VDD to inverting amplifier 31. Thus, current limiting resistors R1–R8 can limit the power consumption by inverting amplifier 31.

Figure 4:
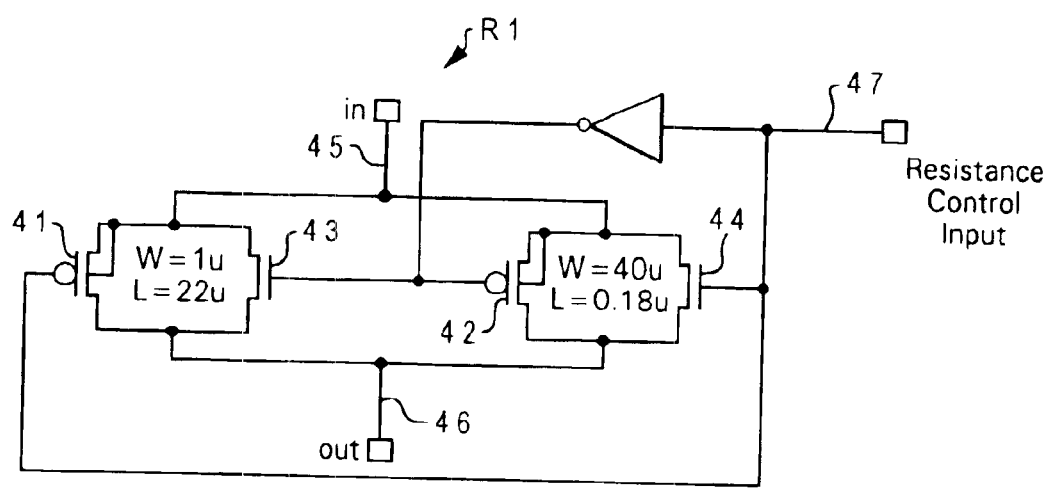
FIG. 4 is a circuit diagram of a current limiting resistor within the real-time clock oscillator from FIG. 3, in accordance with a preferred embodiment of the present invention.

Current limiting resistors R1–R8 are substantially identical with each other. With reference now to FIG. 4, there is depicted a circuit diagram of current limiting resistor R1, in accordance with a preferred embodiment of the present invention. As shown, current limiting resistor R1 includes p-channel transistors 41, 42 and n-channel transistors 43, 44. Preferably, p-channel transistor 41 and n-channel transistor 43 have relatively long channel lengths and relatively short channel widths. On the other hand, p-channel transistor 42 and n-channel transistor 44 have relatively short channel lengths and relatively long channel widths. As such, the resistance between an input 45 and an output 46 is relatively high when the logic level at a resistance control input 47 is low, and the resistance between input 45 and output 46 is relatively low when the logic level at resistance control input 47 is high.

Referring back to FIG. 3, latches L1–L8, which are preferably D flip-flops, provide control to the resistances of current limiting resistors R1–R8. The output of each of latches L1–L8 is connected to a respective resistance control input of current limiting resistors R1–R8. Latches L1–L8, which are connected in a serial fashion, can be thought of as a shift register. Generally, on every clock falling edge, a new value is clocked into a first latch L1 within the shift register. A last latch L8 within the shift register, however, does not always get updated with the output value of the next to the last latch, i.e., latch L7, in the shift register. As shown in FIG. 3, the input to last latch L8 is provided by the outputs of comparators 37–38 and the output of last latch L8 via state machine logic circuit 58. Thus, the value clocked into last latch L8 depends on the voltage amplitude of the outputs of comparators 37–38 as well as the present output state of last latch L8 itself.

Clock gating control logic circuit 50 includes a latch 51 and a delay block 52 along with some gating logic. Based on the outputs of comparators 37–38, clock gating control logic circuit 50 may or may not provide a clock signal at node x to each of latches L1–L8.

Input/output (I/O) ports for clock oscillator 30 include $XTAL_{in}$, $XTAL_{out}$, $OSC_{out}$, $V_{ref}H$, $V_{ref}L$ and LOWBAT. Crystal 34 is connected between $XTAL_{in}$ and $XTAL_{out}$. As an output for clock oscillator 30, $OSC_{out}$ provides an output clock on a real-time basis. $V_{ref}H$ and VrefL are two externally applied reference voltages that represent the upper and lower bounds, respectively, for the output amplitudes of inverting amplifier 31 at node c. For the purpose of the present description, $V_{ref}H$ and $V_{ref}L$ are assumed to be 1.05 V and 0.95 V, respectively. LOWBAT is an output for indicating the presence of a low power supply voltage condition in clock oscillator 30.

During normal operation, the output of inverting amplifier 31 at node c swings between the voltage at node b and GND. If the voltage of node b is at 1.8 V (i.e., VDD in the present embodiment), then the output of inverting amplifier 31 will swing between 1.8 V and GND. The basic idea of the present invention is to control the voltage at node b to be much less than VDD such that the power consumption by clock oscillator 30 can be minimized without impacting the frequency and signal integrity of the clock signal output at $OSC_{out}$. As mentioned previously, the voltage amplitude occurring at node c can be set by the voltage range between $V_{ref}H$ and $V_{ref}L$. If $V_{DD}$ is 1.8 V, $V_{ref}H$ and $V_{ref}$ are preferred to be 1.05 V and 0.95, respectively.

As the value of $V_{DD}$ drops (as in the case when a battery is discharging), adjustments are made automatically to keep the voltage amplitude of node c within the range of $V_{ref}H$ and $V_{ref}L$ accordingly. When $V_{DD}$ drops to within about 50 mV to 75 mV of $V_{ref}H$, such condition is considered to be a low battery voltage condition. After a low battery voltage condition has been detected, decoding logic circuit 59 sends a signal to a low battery signal latch 57 for changing the signal at the LOWBAT output from a logical low to a logical high to indicate the existence of the low battery voltage condition.

When power is first supplied to clock oscillator 30, node z is initially set to a logical high by an initiating circuit 53 having a p-channel transistor 54 and an inverter 55. As a result, the outputs of latches L1–L8 are set to a logical high to cause current limiting resistors R1–R8 to have low resistances, which allows node b to assume the value of VDD. This ensures clock oscillator 30 to startup.

Because node z is initially set to a logical high, low battery signal latch 57 is also initially reset to allow the output signal at LOWBAT to be at a logical low. During startup, the rising edge of node c swings above $V_{ref}H$ and $V_{ref}L$, causing nodes o, p and q to transition to a logical low. On the falling edge of node c, the logical low condition at node q gets loaded into latch L1 the first latch of latches L1–L7. On every subsequent cycle of clock oscillator 30, the voltage at node c is compared to $V_{ref}H$ and $V_{ref}L$ via a comparator 37 and a comparator 38, respectively. Comparators 37 and 38 are preferably asymmetric comparators that are specifically designed for low power applications. Either a logical high or a logical low may get loaded into latch L1. In Table I, case 1 indicates when a logical low gets loaded into latches L1–L7, and case 4 indicates when a logical high gets loaded into latch L1.

TABLE I

| case | node c condition | node c amplitude | node o state | node p state | node q state | node u state | node kk state | node rr state |
|---|---|---|---|---|---|---|---|---|
| 1 | $c > V_{ref}H$ and $c > V_{ref}L$ | too large | 0 | 0 | 0 | 0 | 0 1 | 0 node ṅ = L7 output |
| 2 | $c > V_{ref}H$ and $c < V_{ref}L$ | impossible | | | | | | |
| 3 | $c < V_{ref}H$ and $c > V_{ref}L$ | just right | 1 | 0 | 0 | 1 | | |
| 4 | $c < V_{ref}H$ and $c < V_{ref}L$ | too small | 1 | 1 | 1 | 0 | 0 1 | node ṅ = L7 output 1 |

When controlling the resistances of current limiting resistors R1–R8, the order of logical lows and logical highs are irrelevant. What does matter is the number of logical lows and logical highs in latches L1–L8. In addition, when the output signal at LOWBAT transitions to a logical high, the clocks to latches L1–L8 are gated off, thus saving power during such critical time.

In most cases, new values are not loaded into latches L1–L8, which corresponds to case 3 in Table I. Basically, in case 3, the output amplitude of inverting amplifier 31 falls within the desirable $V_{ref}H$-to-$V_{ref}L$ range and no change is needed to latches L1–L8 for controlling the resistances of resistors R1–R8. Also, as mentioned previously, latch L8 the last latch of latches L1–L9 does not always get updated with the output value of latch L7 because the value clocked into latch L8 depends on the voltage amplitude of node c as well as the present output state of latch L8. When the objective is to increase the number of logical lows in latches L1–L9 regardless of their position, then a logic low is preferably not shifted out from latch L8 even if a logical low is being shifted into latches L1–L8. Similarly, when the number of logical highs in latches L1–L9 needs to be increased, a logical high is not shifted out from latch L8 even if a logical high is being shifted into latches L1–L8.

Figure 5:
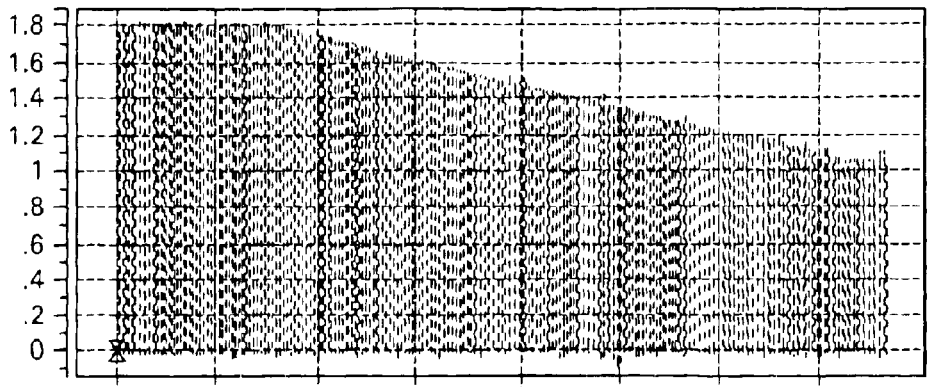
FIGS. 5–7 are waveforms at various nodes within the real-time clock oscillator from FIG. 3, in accordance with a preferred embodiment of the present invention.
Figure 6:
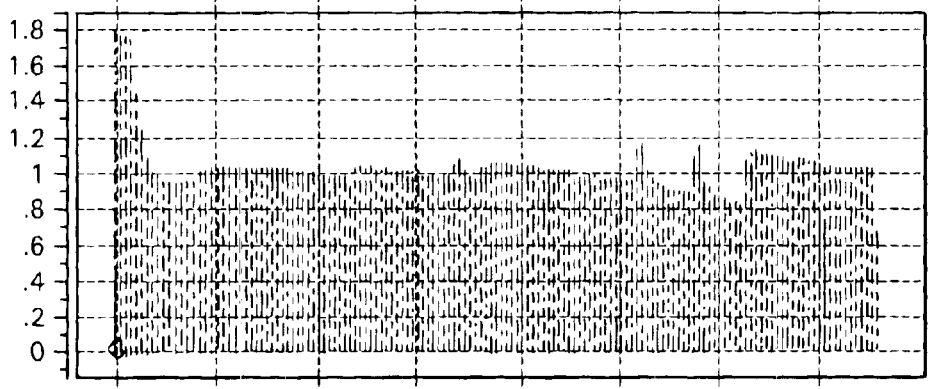
Figure 7:
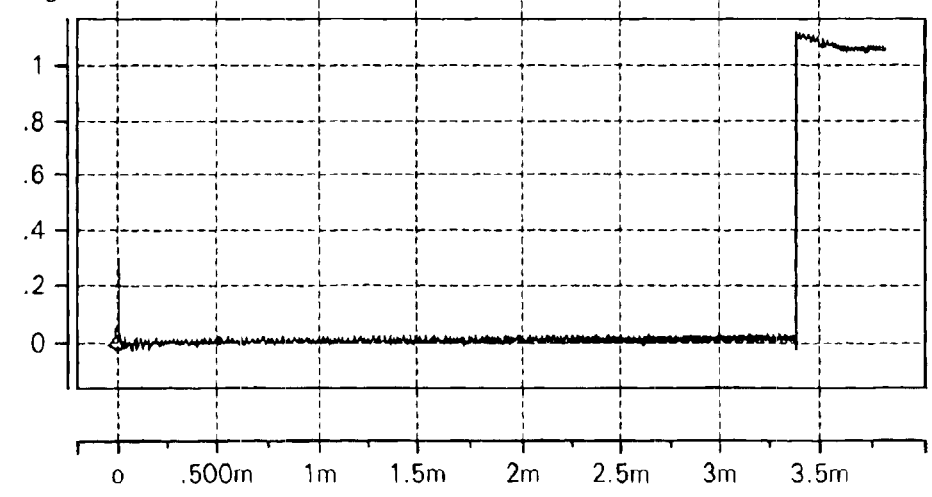

Referring now to FIGS. 5–7, there are depicted simulated waveforms at various node within clock oscillator 30, in accordance with a preferred embodiment of the present invention. FIG. 5 shows the waveforms at node $OSC_{out}$ as the $V_{DD}$ level drops. At approximately 750 µs, VDD starts to decrease from 1.8 V, and at approximately 3.6 ms, VDD has sunk to 1.05 V. Such decrease in voltage simulates a battery discharging, even though it is a rather rapid rate of discharging. FIG. 7 shows the LOWBAT signal changing from a logical low to a logical high at approximately 3.39 ms.

FIG. 6 shows the voltage amplitude at node c. Between time 0 and approximately 60 Fs when latches L1–L8 are in a set state, the voltage at node c swings between VDD and GND. Between approximately 60 µs and 750 µs, latches L1–L8 and current limiting resistors R1–R8 operate together to minimize the voltage swing at node c. From approximately 500 µs to 750 µs, the voltage of node c settles between $V_{ref}H$ and $V_{ref}L$ (i.e., between 1.05 V and 0.95 V in the present embodiment). During this condition, the output clock signal at node x of clock gating logic 50 is gated from toggling latches L1–L8 such that minimal power is being used by clock oscillator 30. At approximately 750 µs, $V_{DD}$ starts to drop and a determination is made as to whether a logical high or a logical low needs to be shifted into latches L1–L8 in order to maintain the voltage value at node c between $V_{ref}H$ and $V_{ref}L$. This cycle continues on until VDD drops to approximately 1.11 V, which is considered as a low battery condition. At this point, the LOWBAT signal changes from a logical low to a logical high, as shown in FIG. 7.

As has been described, the present invention provides an apparatus for controlling and minimizing the power dissipated by a real-time clock oscillator. The present invention makes use of the same analog signal for two different purposes. In one case, the output of inverting amplifier 31 at node c is used as a data signal sampled on its rising edge by comparators 37 and 38. The same signal is also used as a clock that is fed to falling edge triggered latches to capture the data sampled on the rising edge.

Although eight current limiting resistors and eight latches are utilized to illustration the present invention, the number of current limiting resistors between $V_{DD}$ and node b and the number of the corresponding latches are adjustable. The number is chosen according to the desired granularity of the voltage amplitude at node c.

The present invention also provides a means to detect when the battery voltage is reaching a low-voltage condition that may cause the real-time clock oscillator to cease normal operation. The detecting and signaling a low-power supply voltage condition is very useful in most applications.

While the invention has been particularly shown and described with reference to a preferred embodiment, it will be understood by those skilled in the art that various changes in form and detail may be made therein without departing from the spirit and scope of the invention.

What is claimed is:

1. An apparatus for controlling power consumption of a real-time clock oscillator, said apparatus comprising;
 a clock oscillator;
 a plurality of current limiting resistors coupled between a power supply and said clock oscillator; and
 a plurality of latches connected in series to form a shift register configuration, coupled to said clock oscillator and said plurality of current limiting resistors, for controlling said plurality of current limiting resistors to limit the amount of current flowing from said power supply to said clock oscillator such that power consumption of said clock oscillator is minimized.

2. The apparatus of claim 1, wherein said plurality of latches are D flip-flops.

3. The apparatus of claim 1, wherein one of said current limiting resistors includes a first set of transistors having a relatively short channel width along with a relatively long channel length and a second set of transistors having a relatively long channel width along with a relatively short channel length.

4. The apparatus of claim 1, wherein said apparatus further includes a low battery signal latch for yielding a low battery condition signal.

5. The apparatus of claim 1, wherein said apparatus further includes an initiating circuit for starting said clock oscillator.

6. The apparatus of claim 1, wherein said apparatus further includes a first reference voltage input and a second reference voltage input to provide a high voltage limit and a low voltage limit for an inverting amplifier within said clock oscillator.

7. An apparatus for controlling power consumption of a real-time clock oscillator, said apparatus comprising;
 a clock oscillator;
 a plurality of current limiting resistors coupled between a power supply and said clock oscillator; and
 a plurality of latches, coupled to said clock oscillator via a pair of comparators and coupled to said plurality of current limiting resistors, for controlling said plurality of current limiting resistors to limit the amount of current flowing from said power supply to said clock oscillator such that power consumption of said clock oscillator is minimized.

8. An apparatus for providing power control to a real-time clock oscillator, said apparatus comprising:
 a clock oscillator having an inverting amplifier;
 a plurality of current limiting resistors coupled between a power supply and a voltage input of said inverting amplifier;
 a first reference voltage input and a second reference voltage input for providing a high voltage limit and a low voltage limit for said inverting amplifier, respectively; and
 a plurality of latches, coupled to said clock oscillator and said plurality of current limiting resistors, for controlling resistance of each of said plurality of current limiting resistors to limit the amount of current flowing from said power supply to said clock oscillator such that said high voltage limit and said low voltage limit for said inverting amplifier is maintained.

9. The apparatus of claim 8, wherein said plurality of latches are connected in series.

10. The apparatus of claim 8, wherein said plurality of latches are D flip-flops.

11. The apparatus of claim 8, wherein one of said current limiting resistors includes a first set of transistors having a relatively short channel width along a relatively long channel length and a second set of transistors having a relatively long channel width along with a relatively short channel length.

12. The apparatus of claim 8, wherein said apparatus further includes a clock gating control logic circuit for providing a clock signal to each of said plurality of latches.

13. The apparatus of claim 8, wherein said apparatus further includes a low battery signal latch for yielding a low battery condition signal.

14. The apparatus of claim 8, wherein said apparatus further includes an initiating circuit for starting said clock oscillator.

* * * * *